United States Patent
Engelmann et al.

(10) Patent No.: US 9,490,164 B1
(45) Date of Patent: Nov. 8, 2016

(54) TECHNIQUES FOR FORMING CONTACTS FOR ACTIVE BEOL

(71) Applicant: International Business Machines Corporation, Armonk, NY (US)

(72) Inventors: Sebastian U. Engelmann, White Plains, NY (US); Steve J. Holmes, Ossining, NY (US); Qinghuang Lin, Yorktown Heights, NY (US); Nathan P. Marchack, White Plains, NY (US); Eugene J. O'Sullivan, Nyack, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/747,103

(22) Filed: Jun. 23, 2015

(51) Int. Cl.
| | | |
|---|---|---|
| *H01L 21/44* | (2006.01) | |
| *H01L 21/768* | (2006.01) | |
| *H01L 43/12* | (2006.01) | |
| *H01L 21/311* | (2006.01) | |
| *H01L 23/532* | (2006.01) | |
| *H01L 27/22* | (2006.01) | |
| *H01L 23/522* | (2006.01) | |
| *H01L 23/528* | (2006.01) | |
| *H01L 43/08* | (2006.01) | |
| *H01L 43/02* | (2006.01) | |

(52) U.S. Cl.
CPC .... *H01L 21/76829* (2013.01); *H01L 21/31111* (2013.01); *H01L 21/76801* (2013.01); *H01L 21/76802* (2013.01); *H01L 21/76877* (2013.01); *H01L 23/528* (2013.01); *H01L 23/5226* (2013.01); *H01L 23/5329* (2013.01); *H01L 27/222* (2013.01); *H01L 43/12* (2013.01); *H01L 43/02* (2013.01); *H01L 43/08* (2013.01)

(58) Field of Classification Search
CPC ............. H01L 21/76802; H01L 21/76829; H01L 23/5226; H01L 21/31111; H01L 21/76877; H01L 23/528
USPC ........................................................ 438/667
See application file for complete search history.

(56) References Cited

U.S. PATENT DOCUMENTS

| | | | |
|---|---|---|---|
| 7,183,130 B2 * | 2/2007 | Nuetzel .................. | B82Y 10/00 257/E21.665 |
| 7,433,225 B2 | 10/2008 | Worledge | |
| 8,154,115 B1 | 4/2012 | Chan et al. | |
| 8,378,330 B2 | 2/2013 | Horng et al. | |
| 8,535,952 B2 | 9/2013 | Ranjan et al. | |
| 8,574,928 B2 * | 11/2013 | Satoh .................... | H01L 27/222 438/3 |
| 8,590,139 B2 | 11/2013 | Op De Beeck et al. | |
| 8,629,054 B2 | 1/2014 | Jeung et al. | |

(Continued)

Primary Examiner — Luan C Thai
(74) Attorney, Agent, or Firm — Louis J. Percello; Michael J. Chang, LLC

(57) ABSTRACT

In one aspect, a method for forming a contact to a device is provided which includes the steps of: forming a conformal etch stop layer surrounding the device; forming a dielectric layer over and covering the device; forming a contact trench in the dielectric layer, wherein the contact trench is present over the device and extends down to, or beyond, the etch stop layer; exposing a contact region of the device within the contact trench by selectively removing a portion of the etch stop layer covering a top portion of the device; and filling the contact trench with a conductive material to form the contact to the device. Other methods for forming a contact to a device and also to BEOL wiring are provided as are device contact structures.

20 Claims, 8 Drawing Sheets

(56) References Cited

U.S. PATENT DOCUMENTS 8,710,605 B2* 4/2014 Takahashi ............ H01L 27/228
257/421
8,741,161 B2 6/2014 Sonoda et al.
2013/0005148 A1 1/2013 Sonoda et al.
2013/0341801 A1 12/2013 Satoh et al.
2014/0017818 A1 1/2014 Ranjan et al.

* cited by examiner

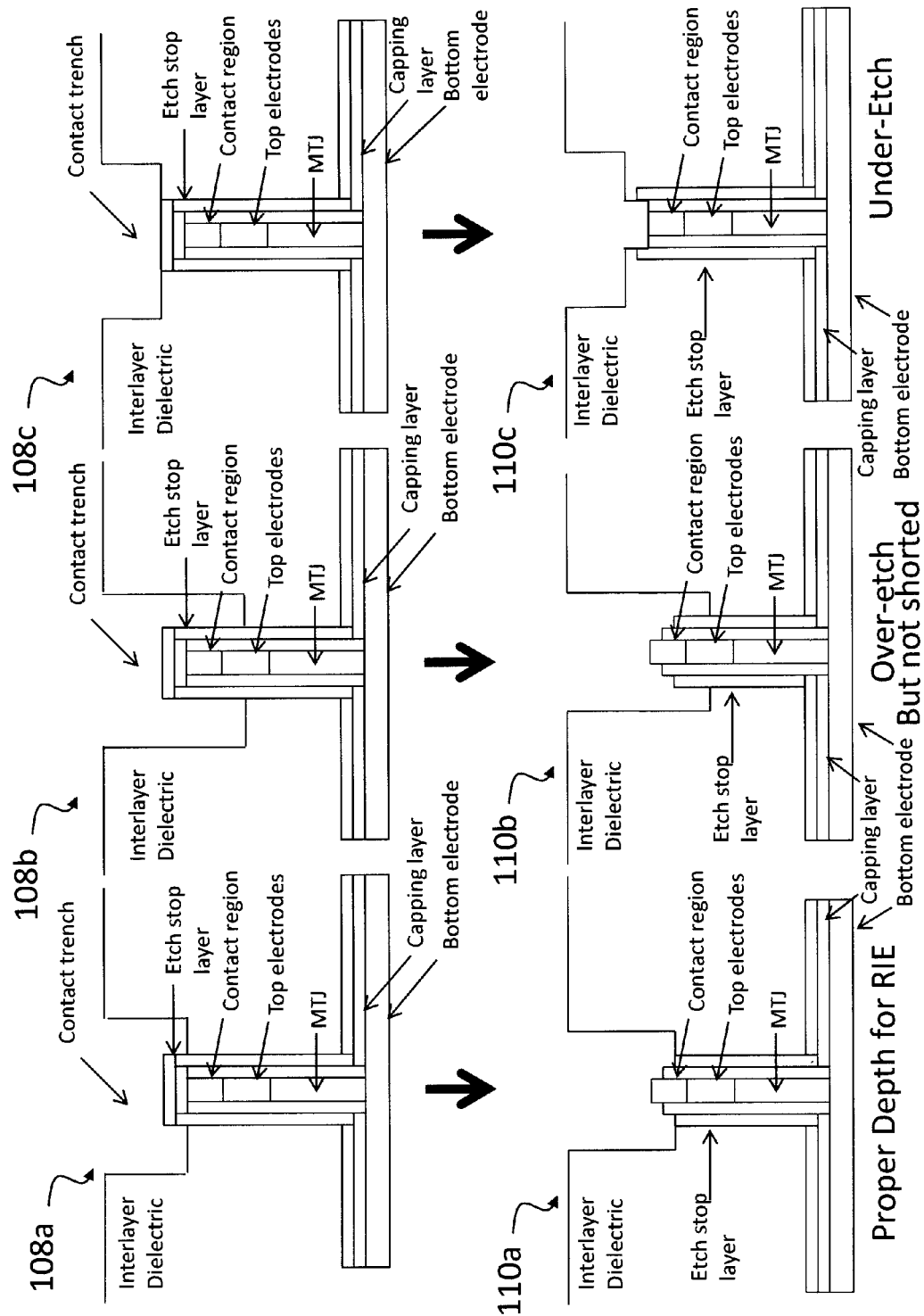
FIG. 1 - continued

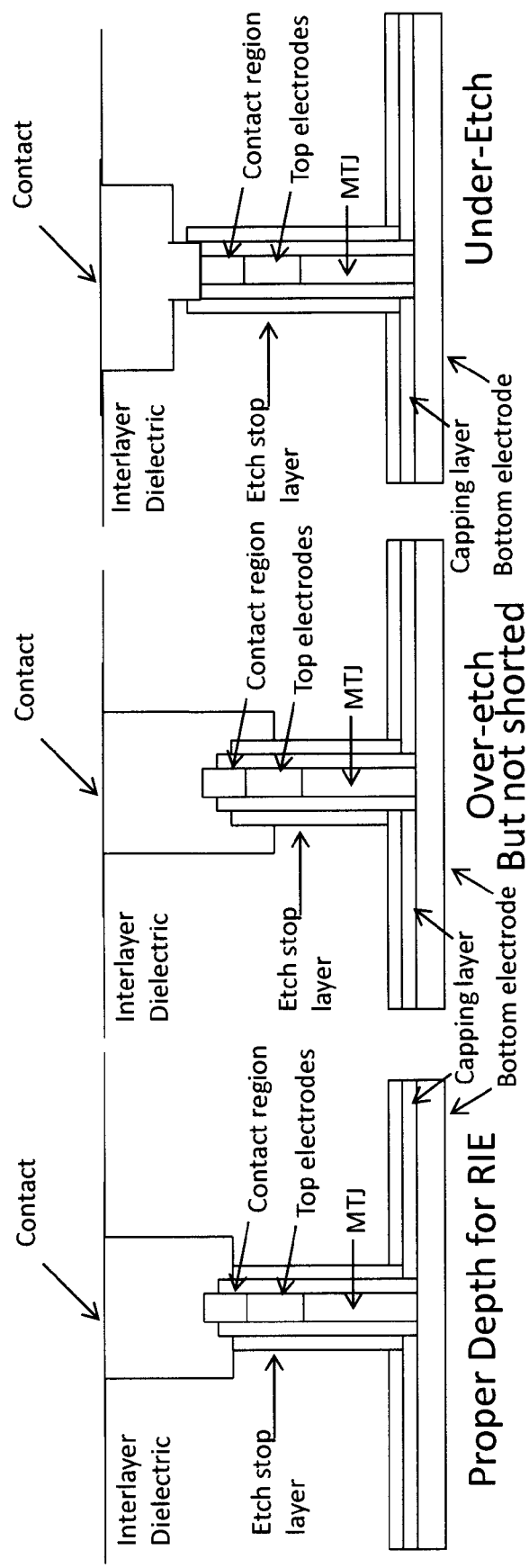
FIG. 2A  Proper Depth for RIE
FIG. 2B  Over-etch But not shorted
FIG. 2C  Under-Etch

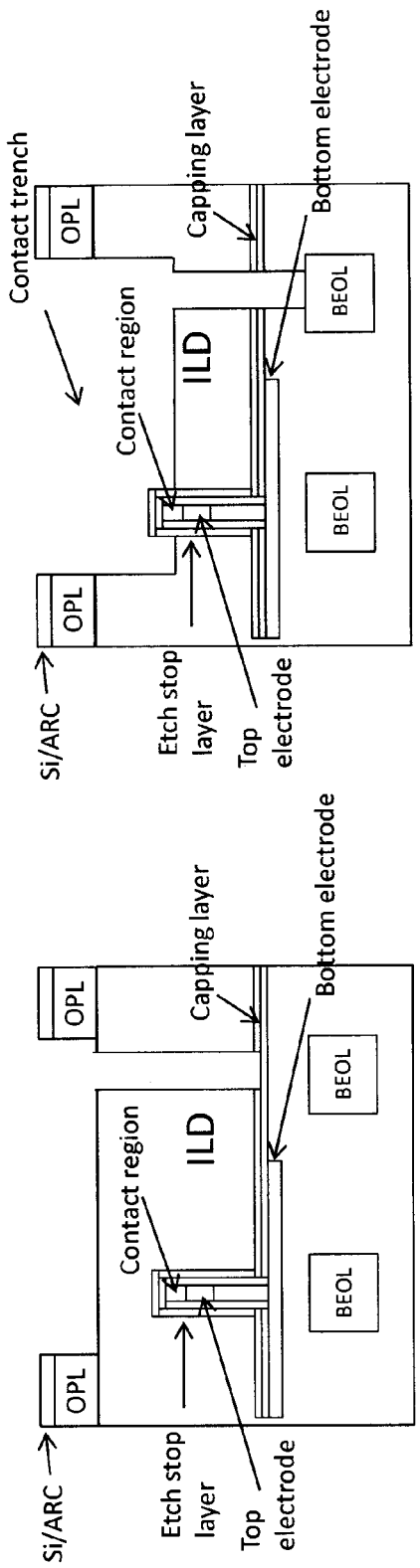
FIG. 7
FIG. 8
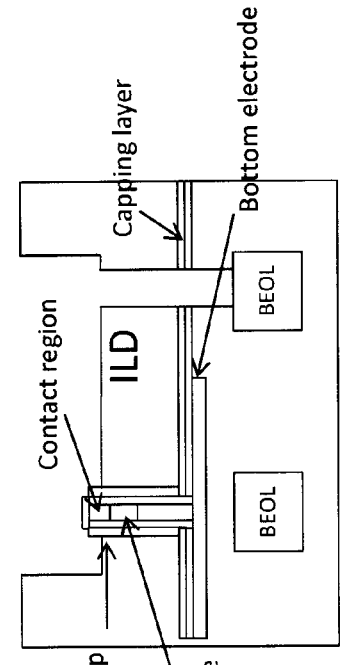
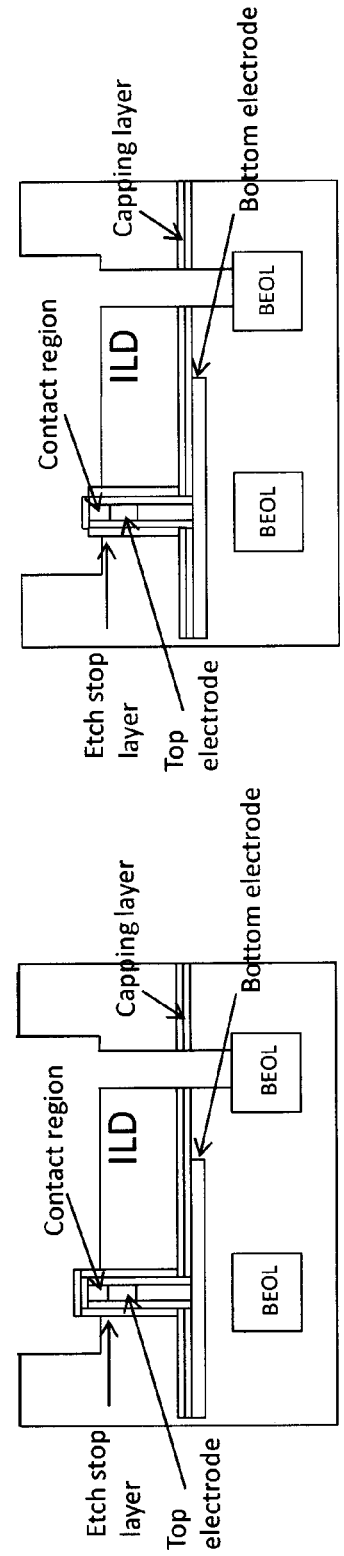
FIG. 9
FIG. 10

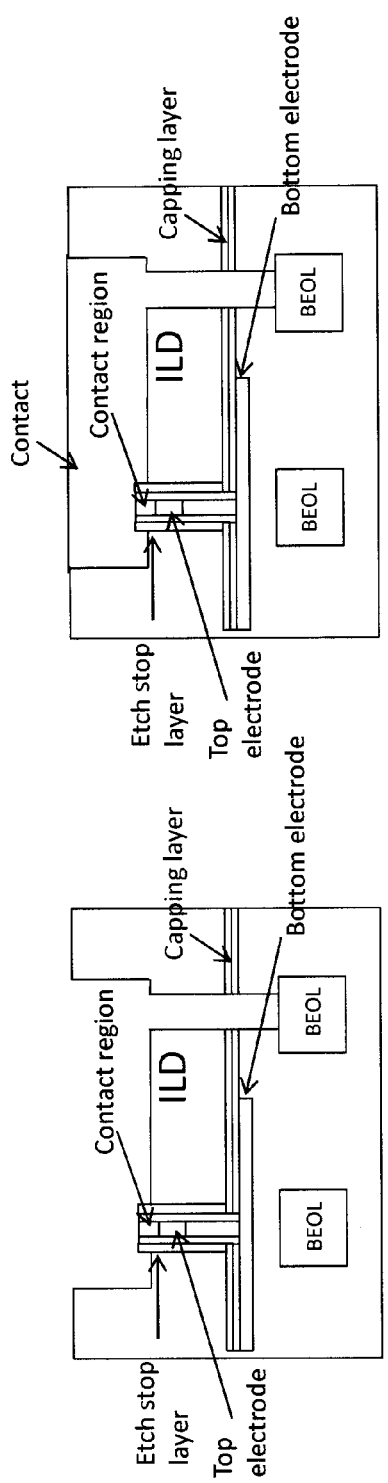
FIG. 11
FIG. 12
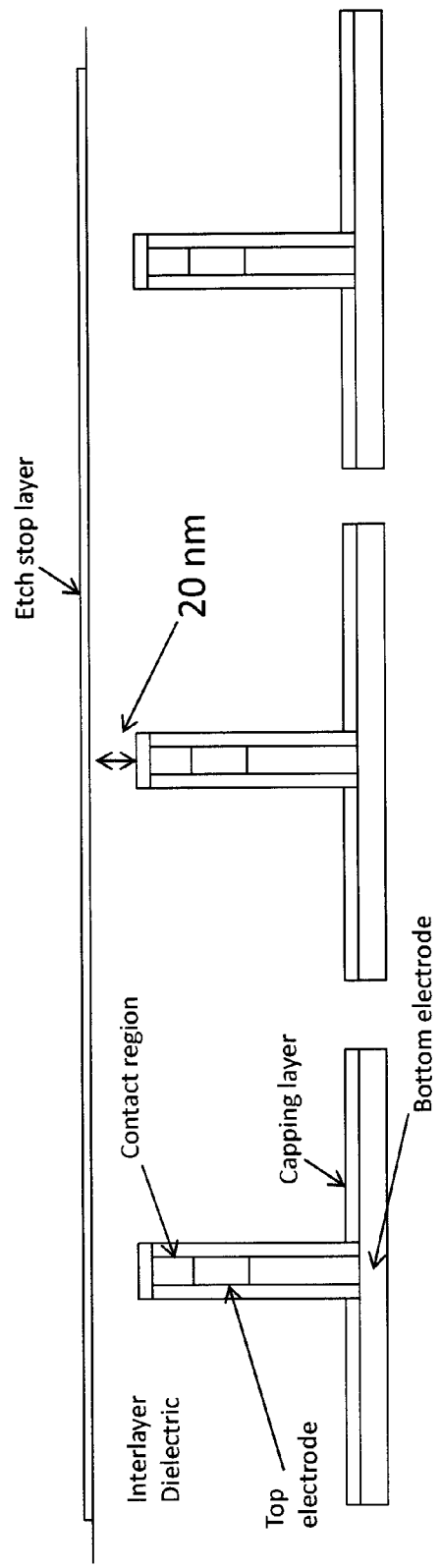
FIG. 13

TECHNIQUES FOR FORMING CONTACTS FOR ACTIVE BEOL

FIELD OF THE INVENTION

The present invention relates to forming device contacts, and more particularly, to techniques for simultaneously forming contacts to functional structures and to back end of line (BEOL) wiring of a device using an etch stop layer around the functional structures to expand the process window for the contact trench etch.

BACKGROUND OF THE INVENTION

With most device applications, contacts need to be formed to both functional structures of the device as well as to the back end of line (BEOL) wiring. For instance, magnetic random access memory (MRAM) devices generally contain a plurality of magnetic memory cells. Contacts are needed to access these magnetic memory cells as well as the (BEOL) wiring adjacent to the magnetic memory cells.

Contact formation generally includes patterning trenches (e.g., in a dielectric) and then filing the trenches with a conductor to form the contacts. While fairly straightforward in theory, in practice this process can present some notable challenges. For instance, one wants to avoid either overetching or underetching the trenches. Namely, overetching beyond the contact region of a magnetic memory cell can undesirably result in a short between the device and the contact. Underetching results in the contact not reaching the magnetic memory cell, thus producing a non-functional device. The contact trenches are often formed using an etching process such as reactive ion etching (or RIE). Non-uniformity of the RIE across a wafer inevitably leads to over or underetching for some of the devices.

Given this variability in the etching process, it is thus extremely difficult to coordinate the processes needed to form contacts to the magnetic memory cells with those needed to form contacts to the BEOL wiring without resulting in some over or underetching of the cells. Accordingly, these two contact structures are typically formed separately from one another. Separate processes however undesirably add to production complexity and cost.

Thus, techniques effective for simultaneously forming contacts to both functional structures and BEOL wiring of a device would be desirable.

SUMMARY OF THE INVENTION

The present invention provides techniques for simultaneously forming contacts to functional structures (e.g., magnetic memory cells) and to back end of line (BEOL) wiring of a device using an etch stop layer around the functional structures to prevent damage during the contact formation process. In one aspect of the invention, a method for forming a contact to a device is provided. The method includes the steps of: forming a conformal etch stop layer surrounding the device; forming a dielectric layer over and covering the device; forming a contact trench in the dielectric layer, wherein the contact trench is present over the device and extends down to, or beyond, the etch stop layer; exposing a contact region of the device within the contact trench by selectively removing a portion of the etch stop layer covering a top portion of the device; and filling the contact trench with a conductive material to form the contact to the device.

In another aspect of the invention, another method for forming a contact to a device is provided. The method includes the steps of: forming a first dielectric layer over and covering the device; forming a blanket etch stop layer on the first dielectric layer; forming a second dielectric layer over the etch stop layer; forming a contact trench in the second dielectric layer stopping on the etch stop layer, wherein the contact trench is present over the device; extending the contact trench through the etch stop layer; extending the contact trench through the first dielectric layer to expose a contact region of the device; and filling the contact trench with a conductive material to form the contact to the device.

In yet another aspect of the invention, a method for forming a contact to a device and to back end of line (BEOL) wiring is provided. The method includes the steps of: forming a conformal etch stop layer that surrounds the device and is present over the BEOL wiring; forming a dielectric layer over and covering the device and the BEOL wiring; forming a contact via in the dielectric layer stopping on the etch stop layer, wherein the contact via is present over the BEOL wiring; extending the contact via through the etch stop layer, down to the BEOL wiring; forming a contact trench in the dielectric layer, wherein the contact trench is present over the device and extends down to, or beyond, the etch stop layer; exposing a contact region of the device within the contact trench by selectively removing a portion of the etch stop layer covering a top portion of the device; and filling the contact trench and the contact via with a conductive material to form the contact to the device and to the BEOL wiring.

In still yet another aspect of the invention, a device contact structure is provided. The device contact structure includes: a conformal etch stop layer surrounding all but a top portion of a device which comprises a contact region of the device; a dielectric layer over and covering the device; and a contact extending through the dielectric layer down to, and in contact with, the contact region of the device.

A more complete understanding of the present invention, as well as further features and advantages of the present invention, will be obtained by reference to the following detailed description and drawings.

BRIEF DESCRIPTION OF THE DRAWINGS

FIG. 2A is a diagram illustrating a contact having been formed in a proper depth trench according to an embodiment of the present invention;

FIG. 2B is a diagram illustrating a contact having been formed in an overetched trench according to an embodiment of the present invention;

FIG. 2C is a diagram illustrating a contact having been formed in an underetched trench according to an embodiment of the present invention;

FIG. 7 is a diagram illustrating a contact trench mask having first formed on the interlayer dielectric with the footprint and location of a contact trench according to an embodiment of the present invention;

FIG. 8 is a diagram illustrating the contact trench mask having been used to pattern a contact trench in the interlayer dielectric according to an embodiment of the present invention;

FIG. 9 is a diagram illustrating the contact trench mask having been removed according to an embodiment of the present invention;

FIG. 10 is a diagram illustrating anisotropic etching having been used to selectively open up the etch stop layer over the top of the contact region according to an embodiment of the present invention;

FIG. 11 is a diagram illustrating another anisotropic etching step having been used to selectively open up the capping layer over the top of the contact region—exposing the top of the contact region according to an embodiment of the present invention;

FIG. 12 is a diagram illustrating a conductive material having been deposited into the contact trench/contact via to form a contact to the magnetic memory cell and the BEOL wiring according to an embodiment of the present invention;

FIG. 13 is a diagram illustrating, in accordance with an exemplary process to form contacts to a functional structure (e.g., a magnetic memory cell) using a blanket etch stop layer, an interlayer dielectric having been formed over the magnetic memory cells, and the etch stop layer having been formed as a blanket layer over the interlayer dielectric according to an embodiment of the present invention;

DETAILED DESCRIPTION OF PREFERRED EMBODIMENTS

As provided above, contact formation to functional structures (such as magnetic memory cells in a magnetic random access memory (MRAM) device) can be challenging since non-uniformity of the contact trench etch can undesirably cause over or underetching of the trenches leading to shorts and non-functioning devices. Due to these challenges, contact formations to functional structures and back end of line (BEOL) wiring are often performed in separate steps.

Advantageously, techniques are provided herein where an etch stop layer is placed around the functional structure and serves to protect the functional structure during the contact trench etch. Use of the present etch stop layer enlarges the process window for the contact trench etch and, according to an exemplary embodiment, advantageously permits contacts to the functional structures and contacts to the BEOL wiring of a device to be formed simultaneously, thereby reducing production complexity and overall production costs.

In the following description, the present techniques will be described in conjunction with an example of an MRAM device wherein the functional structures are individual magnetic memory cells of the MRAM device. This is however only intended to provide an illustrative example, and the present techniques may be broadly applied to any application involving contact formation to the functional units and/or BEOL wiring of a device. Further, while the present teachings may be employed for simultaneously forming contacts to the functional structures and BEOL wiring, the techniques provided herein may also be employed individually for forming contacts to the functional structures or to the BEOL wiring. For instance, as provided above, non-uniformity of the contact trench etch across a given wafer can lead to over or underetching of some of the trenches—which is undesirable. This problem alone can be solved by use of the present etch stop layer which serves to enlarge the process window for the contact trench etch thus enabling the production of more properly functioning devices.

Figure 1:
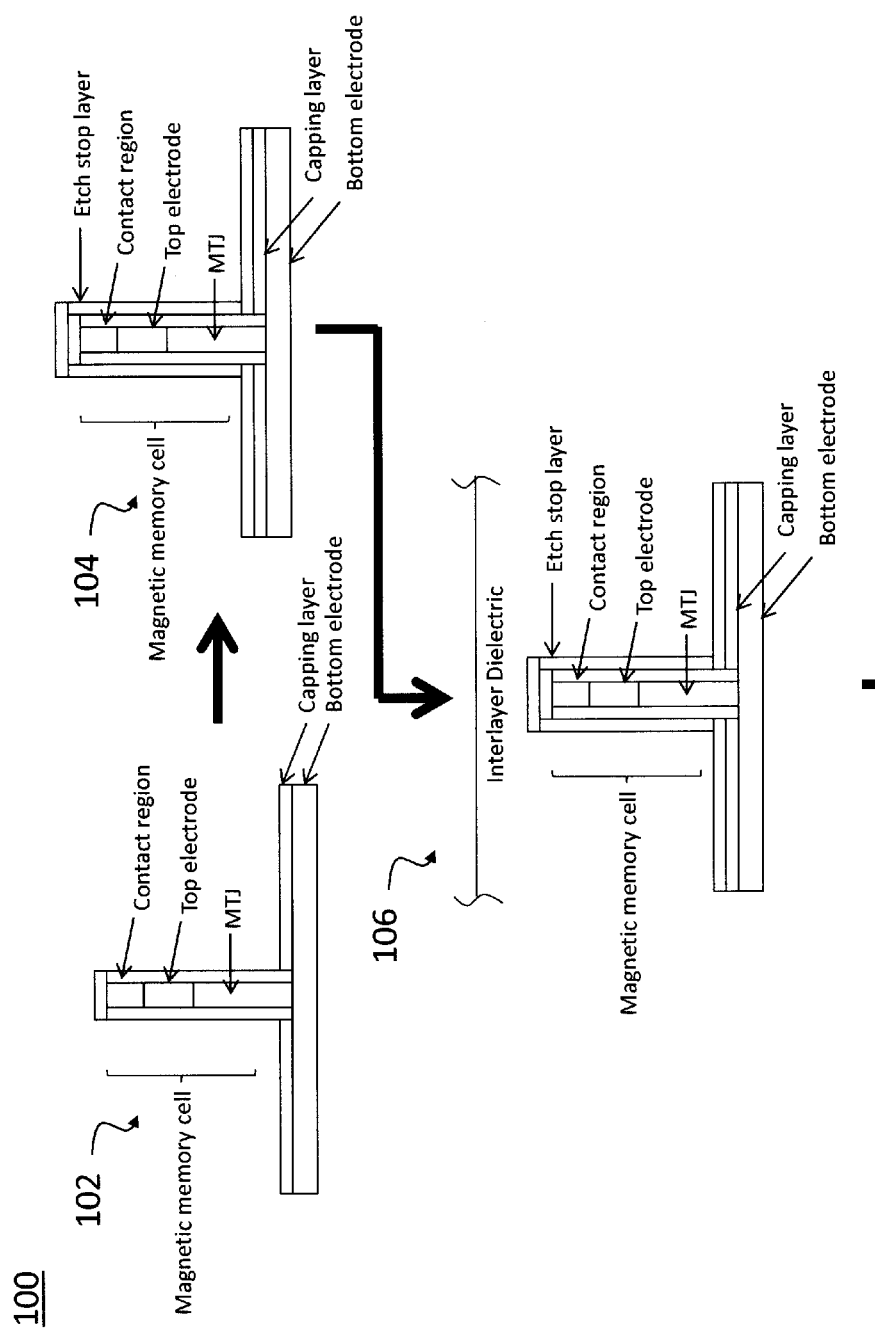
FIG. 1 is a diagram illustrating an exemplary methodology for forming contacts to a functional structure (e.g., a magnetic memory cell) according to an embodiment of the present invention.

In that regard, FIG. 1 is a diagram illustrating an exemplary methodology 100 for use of the present techniques in forming contacts to a functional structure (in this case a magnetic memory cell). The process begins in step 102 with a magnetic memory cell. The process for forming the functional structure—in this case a magnetic memory cell—is peripheral to the present techniques. Namely it is assumed herein that the functional structure has been formed using techniques known in the art. By way of example only, in the context of an MRAM device, the formation of a magnetic memory cell is described, for instance, in U.S. Pat. No. 7,433,225 issued to Worledge, entitled "Scalable Magnetic Random Access Memory Device," the contents of which are incorporated by reference as if fully set forth herein. In the example shown in FIG. 1, the magnetic memory cell includes a magnetic tunnel junction (or MTJ), top and bottom electrodes, and a capping layer (e.g., a silicon nitride (SiN) capping layer). See, for example, U.S. Pat. No. 8,378,330 issued to Horng et al., entitled "Capping Layer for a Magnetic Tunnel Junction Device to Enhance dR/R and a Method of Making the Same," the contents of which are incorporated by reference as if fully set forth herein. As known in the art, an MTJ typically includes at least two magnetic layers coupled by a coupling layer therebetween.

Pertinent to the present techniques is that a contact region (labeled "contact region") is present on the top of the magnetic memory cell. For proper access to be made to the magnetic memory cell, contact must be made only to this contact region. Namely, falling short of contacting the contact region will not provide access to the magnetic memory cell, and contacting structures beneath the contact region (such as the top electrode) can result in shorting of the magnetic memory cell. With the conventional processes described above, this would be the result of under or overetching the contact trenches, respectively.

However, advantageously, according to the present techniques in step 104 an etch stop layer is next formed surrounding the functional structure, i.e., the magnetic memory cell. As shown in FIG. 1, according to an exemplary embodiment, the etch stop layer is a conformal layer formed over and covering the magnetic memory cell. By way of example only, the etch stop layer can be formed from titanium oxide, titanium oxynitride, hafnium oxide, hafnium nitride, and/or combinations of the foregoing etch stop materials, deposited using a conformal deposition process such as chemical vapor deposition (CVD) or atomic layer deposition (ALD), to a thickness of from about 5 nanometers (nm) to about 10 nm, and ranges therebetween.

To act as an etch stop, the etch stop layer should be formed from a material that is not removed during the contact trench etch (to be performed later in the process). To look at it another way, once a dielectric has been deposited over the magnetic memory cell (see below) contact trenches can be etched in the dielectric selective to the etch stop layer. The exemplary materials provided above for the etch stop layer would serve this purpose vis-à-vis commonly employed interlayer dielectrics (ILDs) such as silicon dioxide ($SiO_2$).

Namely, in step 106 an interlayer dielectric is deposited over, covering/burying, the magnetic memory cell. According to an exemplary embodiment, the interlayer dielectric is formed from $SiO_2$, deposited using CVD.

In step 108, contact trenches are formed in the interlayer dielectric over the magnetic memory cell. Standard lithography and etching techniques may be employed to form the contact trenches in the interlayer dielectric (see below). According to an exemplary embodiment, the contact trench etch is performed using reactive ion etching (RIE). Further, as highlighted above, the etch employed should be selective for the interlayer dielectric over the etch stopping layer. This selectivity can be achieved by tailoring the etch chemistries. For instance, a fluorine-based RIE (F-chemistry) can be used to etch $SiO_2$ selective to a titanium-containing etch stop layer.

Advantageously, the etch stop layer prevents any over or underetching that might occur in this step from negatively affecting the functional structure. Namely, in the case of underetching, as long as the contact trench reaches the etch stopping layer then (subsequent) removal of the etch stopping layer will expose the contact region of the magnetic memory cell allowing for proper contact. In the case of over etching, the etch stopping layer will remain present after the contact trench etch preventing shorting of the magnetic memory cell. To best illustrate each of these scenarios, FIG. 1 shows the structure after contact trench etch in the case of a proper depth trench (step 108a), an overetch (step 108b), and an underetch (step 108c). Specifically, for the case of a proper etch depth, the contact trench extends past the etch stop layer down to the top of the contact region (step 108a). However, as provided above, non-uniformity in the dielectric RIE across a wafer makes it extremely difficult to achieve the proper depth for each contact trench. Namely, while FIG. 1 highlights the contact formation process for a single magnetic memory cell, it is to be understood that the present techniques are in many applications applied to (simultaneously) form contacts to multiple devices on a common wafer. Thus, any amount of non-uniformity in the etching process will make it virtually impossible to produce trenches of the same depth across an entire wafer. Thus, as per step 108b the scenario is addressed where some level of overetching has occurred. Based on non-uniformity in the etching process, overetching in some regions of the wafer may be necessary in order to achieve the proper contact in other areas of the wafer.

As shown in FIG. 1, in the case of an overetch the contact trench extends past the etch stop layer and past the contact region (step 108b). In conventional processes, this amount of overetching would likely result in a short since the contact (formed in the trench) would contact the top electrode. However, the present etch stop layer remains covering the top electrode. As per step 108c, the scenario is addressed where underetching has occurred. Underetching in this case refers to a trench depth that is less than the proper depth (see step 108a—described above). As shown in FIG. 1, in the case of an underetch, the contact trench extends down to the etch stop layer. With conventional processes, unless the trench exposes the contact region the device will not be functional. In the present case, however, as long as the contact trench reaches the etch stop layer, proper contact with the magnetic memory cells can be achieved.

The next task is to expose the (top) contact region of the magnetic memory cell within the contact trench. In general, this involves selectively opening the etch stop layer, and whatever layers are beneath it (if any) above the contact region. According to an exemplary embodiment, a RIE step is used to open up the etch stop layer. By way of example only, a chlorine-based RIE chemistry is suitable for etching a titanium-containing etch stop layer. RIE is ideal for selectively opening up the etch stop layer since RIE is generally an anisotropic (directional) etching process that will predominately etch the horizontal surfaces of the etch stop layer while leaving the vertical surfaces of the etch stop layer predominately intact. Thus, as shown in FIG. 1 this etch step will serve to remove the top surface portion of the etch stop layer covering the contact region (thereby exposing the tops of the contact regions) while leaving the portions of the etch stop layer covering the sidewalls of the magnetic memory cells intact and protecting the regions of the magnetic memory cells beneath the contact regions. An anisotropic etching process can also be used to remove any layers underneath the etch stop layer (if any) that are present between the etch stop layer and the contact region. For instance, in the present example, the capping layer is present beneath the etch stop layer. By way of example only, a nitride-selective (anisotropic) RIE can be used (in the same manner as above) to remove a nitride-based capping layer from horizontal surfaces of the contact area.

To best illustrate each of these scenarios, FIG. 1 shows the structure after the etch stop layer and the capping layer have been opened up over the top of the magnetic memory cell, exposing the contact region, in the case of a proper depth trench (step 110a), an overetch (step 110b), and an underetch (step 110c). Advantageously, based on the selectivity of the etch in opening up only the top of the etch stop layer (and the tops of any underlying layers) as described above, the sides of the magnetic memory cell largely remain covered by the etch stop layer—even in the case of an overetched contact trench (as per step 110b). Thus, as indicated in FIG. 1 (step 110b), notwithstanding some overetching of the contact trench there is no shorting of the device since only the top of the contact region is exposed.

To complete the process, a conductive material, such as a contact metal, is deposited into the trenches, planarized, etc. according to standard procedures. FIGS. 2A, 2B, and 2C illustrate the completed device contact structure (i.e., the functional structure with contact formed thereto) in the case of the proper depth trench, an overetched trench, and an underetched trench, respectively. In all three cases, proper contact is made to the contact region.

As provided above, by expanding the process window for the contact trench etch (i.e., through use of the present etch stop layer, as described above, even under or overetched trenches can result in proper contact) the present techniques enable effective formation of contacts to functional structures (such as magnetic memory cells) and adjacent BEOL wiring at the same time (i.e., simultaneously).

An exemplary implementation of the present techniques to simultaneously form contacts to a functional structure (e.g., a magnetic memory cell) and nearby BEOL wiring is now described by way of reference to FIGS. 3-12. The magnetic memory cell used in this particular example has the same structure as in FIG. 1 above, namely a magnetic tunnel junction (or MTJ), top and bottom electrodes, a capping layer, and a contact region on the top electrode. As above, an etch stop layer is formed surrounding the functional structure, i.e., the magnetic memory cell. However in the present example, the etch stop layer and the capping layer both extend beyond the magnetic memory cell such they are also present over BEOL wiring to which the contact will be made. Examples of suitable etch stop materials were provided above for use in accordance with the present techniques. Further, as in the example provided above, an interlayer dielectric (ILD) is formed over/covering the magnetic memory cell.

Figure 3:
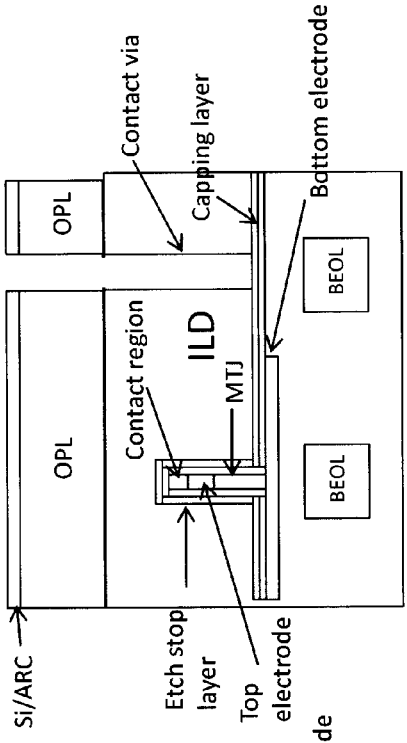
FIG. 3 is a diagram illustrating, in accordance with an exemplary process to simultaneously form contacts to a functional structure (e.g., a magnetic memory cell) and BEOL wiring, a mask having been patterned on an interlayer dielectric with the footprint and location of a contact via according to an embodiment of the present invention.

As shown in FIG. 3, the first task is to pattern a mask on the interlayer dielectric with the footprint and location of a contact via. The contact via is formed over the BEOL wiring. By way of example only, the patterned mask is a tri-layer lithographic mask including an organic planarizing layer (OPL), an anti-reflective coating (ARC) (e.g., SiARC), and a resist layer (not shown). Standard lithography and etching can be used to pattern the ARC and the OPL with the footprint and location of the contact via—see FIG. 3.

Figure 4:
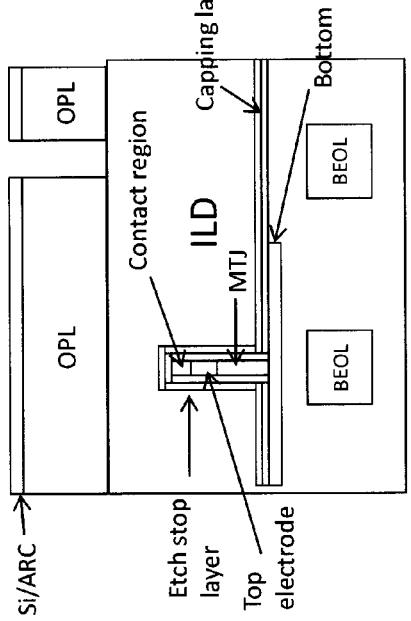
FIG. 4 is a diagram illustrating the mask having been used to pattern a contact via in the interlayer dielectric stopping on an etch stop layer over the magnetic memory cell and BEOL wiring according to an embodiment of the present invention.

Next, as shown in FIG. 4, the mask is used to pattern the via in the interlayer dielectric stopping on the etch stop layer. As provided above, a fluorine-based RIE (F-chemistry) can be used to etch $SiO_2$ selective to a titanium-containing etch stop layer. As described above, wafer processing typically involves the formation of contacts to multiple devices on a wafer, and non-uniformity in the RIE process across a wafer can lead to variations in the depths of the contact trenches. The same is true for vias etched in the same manner as shown in FIG. 4. However, advantageously, in accordance with the present techniques the presence of the etch stop layer over the BEOL wiring allows for all of the contact vias on the wafer to be made to a uniform depth. Namely, with an etch stop in place, a longer etch time can be employed to insure that all of the contact vias being formed reach a uniform depth (set by the etch stop layer).

Figure 5:
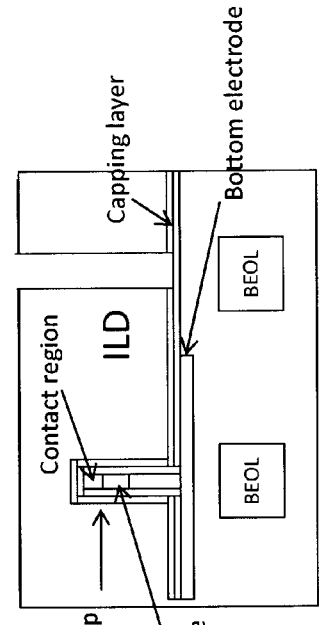
FIG. 5 is a diagram illustrating the contact via having been extended through the etch stop layer according to an embodiment of the present invention.
Figure 6:
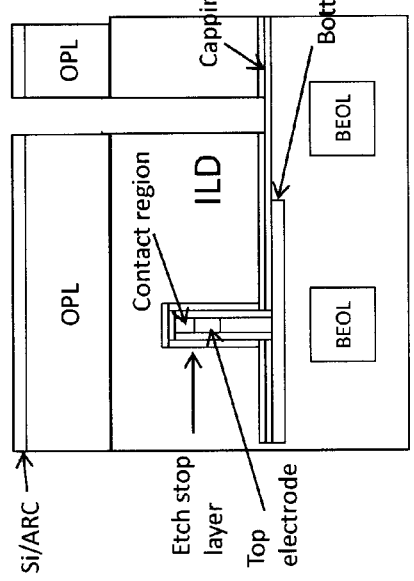
FIG. 6 is a diagram illustrating the contact via mask having been removed according to an embodiment of the present invention.

As shown in FIG. 5, the contact via is next extended through the etch stop layer. As provided above, a chlorine-based RIE chemistry is suitable for etching a titanium-containing etch stop layer. The contact via mask can then be removed (e.g., using an oxygen ($O_2$) or nitrogen/hydrogen ($N_2/H_2$) plasma). See FIG. 6.

A contact trench is then patterned in the interlayer dielectric over the magnetic memory cell. Namely, as shown in FIG. 7 a mask is first formed on the interlayer dielectric with the footprint and location of the contact trench. In the same manner as described above, the mask can be a tri-layer lithographic mask including an OPL, an ARC (e.g., SiARC), and a resist layer (not shown). The mask can then be used to pattern the contact trench in the interlayer dielectric. See FIG. 8. The contact trench shown in the figures is formed down to the contact region and is thus of a proper depth. However, as provided, for example, in conjunction with the description of FIG. 1 above, due to the presence of the etch stop layer, the process window for the contact trench etch is expanded and some over or underetching is acceptable without resulting in a failed device.

The contact trench mask can then be removed (e.g., using an oxygen ($O_2$) or nitrogen/hydrogen ($N_2/H_2$) plasma). See FIG. 9. The next task is to selectively expose the contact region of the magnetic memory cell within the contact trench. This process was described in detail above. As provided above, anisotropic etching (e.g., RIE) is used to first selectively open up the etch stop layer over the top of the contact region. See FIG. 10. Another RIE step (e.g., a nitride-selective (anisotropic) RIE can be used to remove a nitride-based capping layer from horizontal surfaces of the contact area—see above) is then used to selectively open up the capping layer over the top of the contact region— exposing the top of the contact region. See FIG. 11. Finally, a conductive material, such as a contact metal, is deposited into the contact trench/contact via, planarized, etc. according to standard procedures to form the contact to the magnetic memory cell and the BEOL wiring. See FIG. 12.

As provided above, simply having an etch stop layer present above the BEOL wiring can help unify the contact trench RIE across the wafer. The same concept can be applied to the functional structure. Namely, an exemplary embodiment is now described by way of reference to FIGS. 13-16 wherein a blanket etch stop layer is provided over multiple magnetic memory cells to unify the contact trench depth over these devices. The magnetic memory cells used in this particular example each have the same structure as in FIG. 1 above, namely a magnetic tunnel junction (or MTJ), top and bottom electrodes, a capping layer, and a contact region on the top electrode. Further, as in the example provided above, an interlayer dielectric (ILD) is formed over/covering the magnetic memory cells. By contrast, however, in the present example the etch stop layer is formed as a blanket layer over the interlayer dielectric. See FIG. 13. By way of example only, once the interlayer dielectric has been deposited over the magnetic memory cells, it can be polished to provide a uniform/planar surface on which to deposit the present etch stop layer. Examples of suitable etch stop materials were provided above for use in accordance with the present techniques. As shown in FIG. 13, the etch stop layer should preferably be located close to the tops of the magnetic memory cells. For example, the etch stop layer is preferably separated from the tops of the magnetic memory cells by a distance of from about 10 nm to about 25 nm, and ranges therebetween, e.g., about 20 nm. This is done to provide only a minimal distance the contact trenches have to be extended down beyond the etch stop layer to reach the magnetic memory cells (see below)— thereby minimizing variations in the contact trench RIE.

Figure 14:
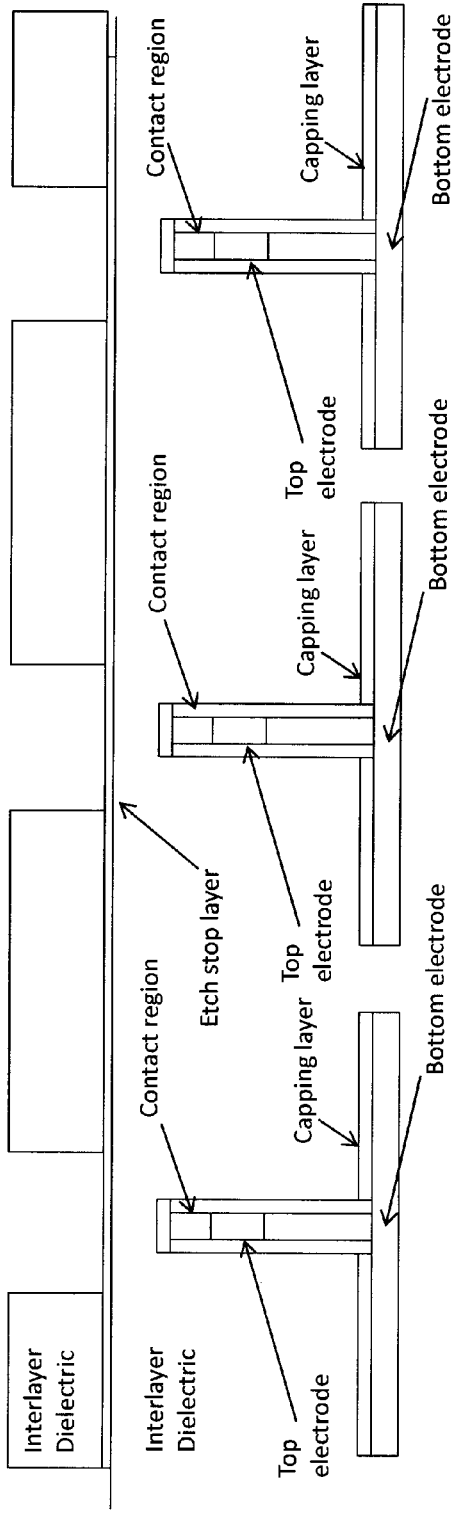
FIG. 14 is a diagram illustrating a second interlayer dielectric having been deposited above the etch stop layer, and patterned with the footprint and location of contact trenches according to an embodiment of the present invention.
Figure 15:
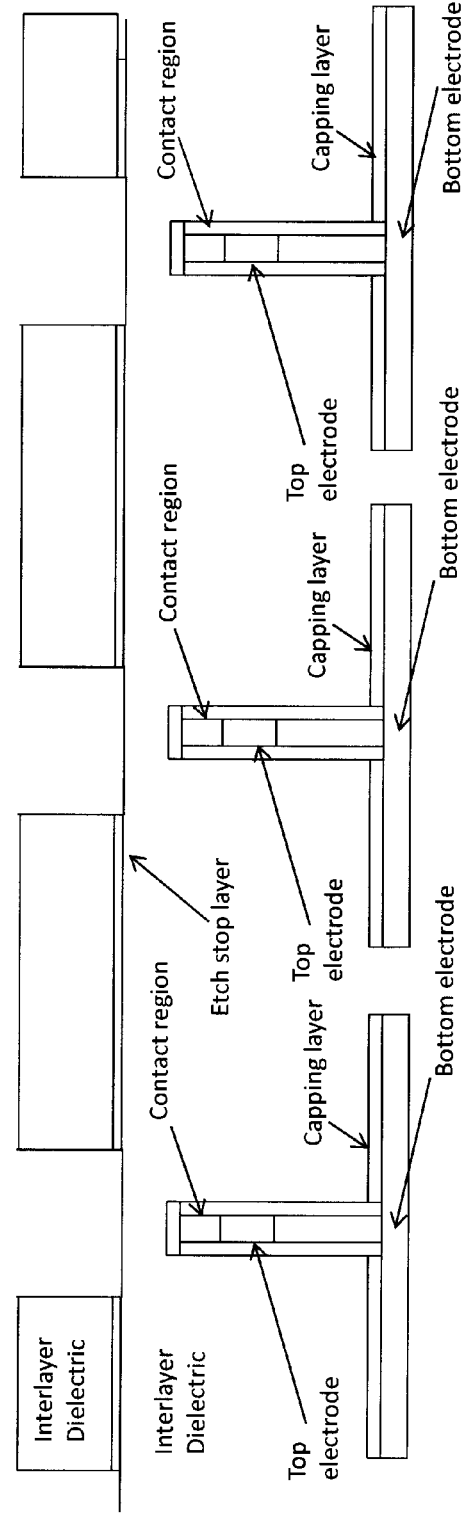
FIG. 15 is a diagram illustrating the contact trenches having been extended through the etch stop layer according to an embodiment of the present invention.

Next, as shown in FIG. 14, a second interlayer dielectric is deposited above the etch stop layer, and patterned with the footprint and location of the contact trenches. The process for forming a mask and using the mask to pattern contact trenches in an interlayer dielectric was described above, and thus these details are not shown in FIG. 14. As provided above, a fluorine-based RIE (F-chemistry) can be used to etch $SiO_2$ selective to a titanium-containing etch stop layer.

Figure 16:
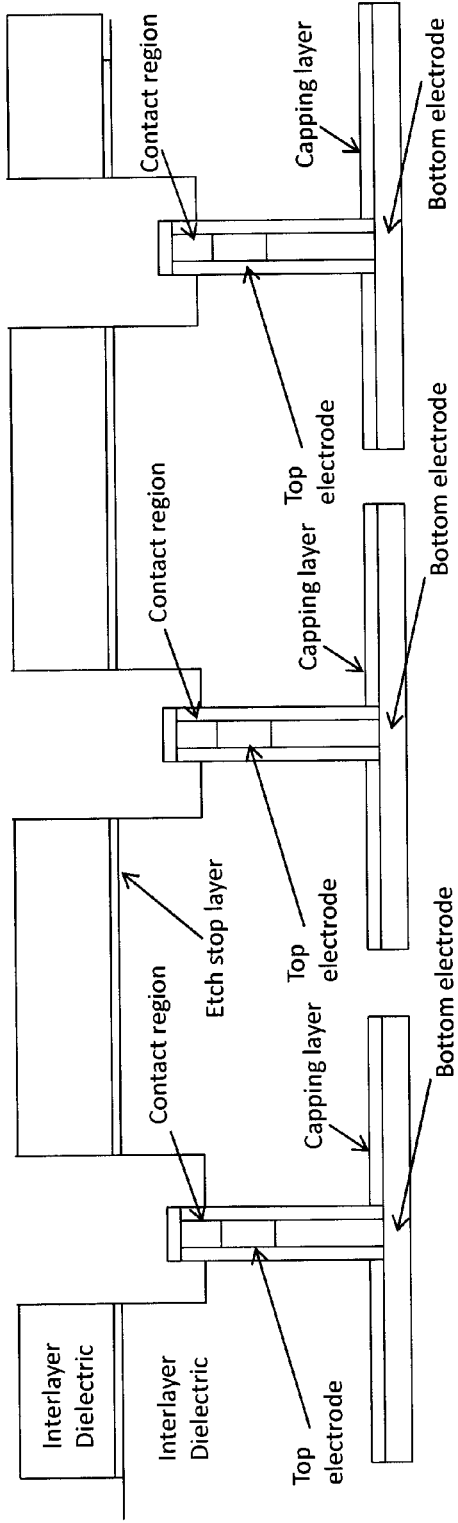
FIG. 16 is a diagram illustrating the contact trenches having been extended down to, and exposing the tops of the magnetic memory cells according to an embodiment of the present invention.

The contact trenches are then extended through the etch stop layer. See FIG. 15. As provided above, a chlorine-based RIE chemistry is suitable for etching a titanium-containing etch stop layer. Switching back, for example, to a fluorine-based RIE chemistry, the trenches can then be extended down to, and exposing the tops of the magnetic memory cells. See FIG. 16. Advantageously, since the distance from the etch stop layer to the tops of the magnetic memory cells is short (e.g., from about 10 nm to about 25 nm, and ranges therebetween, e.g., about 20 nm—see above), this final etch to expose the magnetic memory cells can be more easily controlled to prevent overetching. As shown in FIG. 16, this process scheme makes it easier to produce contact trenches to the proper depth (i.e., down to and exposing only the contact region).

Figure 17:
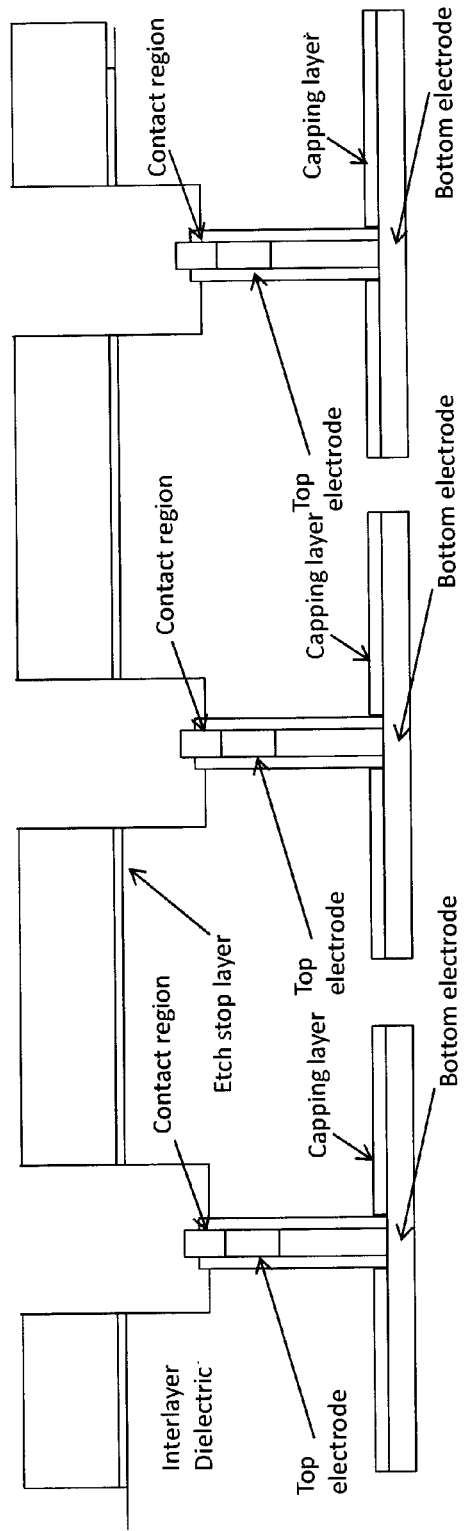
FIG. 17 is a diagram illustrating an anisotropic RIE having been used to expose the top surface of the contact area of each of the magnetic memory cells according to an embodiment of the present invention.

An anisotropic RIE (e.g., a nitride-selective (anisotropic) RIE can be used to remove a nitride-based capping layer— see above) is then used to expose the top surface of the contact area of each of the magnetic memory cells. See FIG. 17. A contact material (not shown) can then be deposited into the contact trenches in the same manner as described above to form the contacts to the magnetic memory cells.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A method for simultaneously forming contacts to multiple devices, the method comprising the steps of:
   forming a conformal etch stop layer surrounding the devices;
   forming a dielectric layer over and covering the devices;
   forming contact trenches in the dielectric layer, wherein the contact trenches are present over the devices, and wherein a depth of the contact trenches is non-uniform such that at least one of the contact trenches extends down to the etch stop layer and at least another one of the contact trenches extends down beyond the etch stop layer;
   exposing contact regions of the devices within the contact trenches by selectively removing a portion of the etch stop layer covering a top portion of the devices; and
   filling the contact trenches with a conductive material to form the contacts to the devices.

2. The method of claim 1, wherein the devices comprise magnetic memory cells each having a magnetic tunnel junction between a top and a bottom electrode, and wherein the contact regions are present above the top electrode.

3. The method of claim 2, wherein the devices each further comprise a capping layer surrounding the magnetic memory cells.

4. The method of claim 3, further comprising the step of:
   selectively removing a portion of the capping layer to expose the contact region of the devices within the contact trenches.

5. The method of claim 1, wherein the conformal etch stop layer comprises one or more of titanium oxide, titanium oxynitride, hafnium oxide, and hafnium nitride.

6. The method of claim 1, wherein the conformal etch stop layer has a thickness of from about 5 nanometers to about 10 nanometers, and ranges therebetween.

7. The method of claim 5, wherein the portion of the etch stop layer covering the top portion of the devices is selectively removed using an anisotropic etching process.

8. The method of claim 5, wherein the portion of the etch stop layer covering the top portion of the devices is selectively removed using a chlorine-based reactive ion etching process.

9. The method of claim 1, wherein the dielectric layer comprises silicon dioxide.

10. A method for forming a contact to a device, the method comprising the steps of:
    forming a first dielectric layer over and covering the device;
    polishing the first dielectric to provide a planar surface;
    forming a blanket etch stop layer on the planar surface of the first dielectric layer;
    forming a second dielectric layer over the etch stop layer;
    forming a contact trench in the second dielectric layer stopping on the etch stop layer, wherein the contact trench is present over the device;
    extending the contact trench through the etch stop layer;
    extending the contact trench through the first dielectric layer to expose a contact region of the device; and
    filling the contact trench with a conductive material to form the contact to the device.

11. The method of claim 10, wherein the device comprises a magnetic memory cell having a magnetic tunnel junction between a top and a bottom electrode, wherein the contact region is present above the top electrode, and wherein the etch stop layer is separated from the magnetic memory cell by only a distance of from about 10 nanometers to about 25 nanometers, and ranges therebetween.

12. The method of claim 11, wherein the device further comprises a capping layer surrounding the magnetic memory cell.

13. The method of claim 12, further comprising the step of:
    selectively removing a portion of the capping layer to expose the contact region of the device.

14. The method of claim 10, wherein the conformal etch stop layer comprises one or more of titanium oxide, titanium oxynitride, hafnium oxide, and hafnium nitride.

15. The method of claim 14, wherein the contact trench is extended through the etch stop layer using an anisotropic etching process.

16. The method of claim 15, wherein the contact trench is extended through the etch stop layer using a chlorine-based reactive ion etching process.

17. A method for forming a contact to a device and to back end of line (BEOL) wiring, the method comprising the steps of:
    forming a conformal etch stop layer that surrounds the device and is present over the BEOL wiring;
    forming a dielectric layer over and covering the device and the BEOL wiring;
    forming a contact via in the dielectric layer stopping on the etch stop layer, wherein the contact via is present over the BEOL wiring;
    extending the contact via through the etch stop layer, down to the BEOL wiring;
    after the contact via has been formed and extended down to the BEOL wiring, forming a contact trench in the dielectric layer, wherein the contact trench is present over the device and extends down to, or beyond, the etch stop layer;
    exposing a contact region of the device within the contact trench by selectively removing a portion of the etch stop layer covering a top portion of the device; and
    filling the contact trench and the contact via with a conductive material to form the contact to the device and to the BEOL wiring.

18. The method of claim 17, wherein the device comprises a magnetic memory cell having a magnetic tunnel junction between a top and a bottom electrode, and wherein the contact region is present above the top electrode.

19. A device contact structure, comprising:
    a conformal etch stop layer surrounding all but a top portion of multiple devices, wherein the top portion comprises a contact region of the devices;
    a dielectric layer over and covering the devices;

contact trenches in the dielectric layer over the devices wherein a depth of the contact trenches is non-uniform such that at least one of the contact trenches extends down to the etch stop layer and at least another one of the contact trenches extends beyond the etch stop layer contacts within the contact trenches extending through the dielectric layer down to, and in contact with, the contact region of the devices.

20. The device contact structure of claim 19, wherein the conformal etch stop layer comprises one or more of titanium oxide, titanium oxynitride, hafnium oxide, and hafnium nitride.

* * * * *